(12) United States Patent
Kikuchi et al.

(10) Patent No.: US 8,518,744 B2
(45) Date of Patent: Aug. 27, 2013

(54) METHOD OF MANUFACTURING SEMICONDUCTOR DEVICE

(75) Inventors: Takashi Kikuchi, Tokyo (JP); Koichi Kanemoto, Tokyo (JP); Chuichi Miyazaki, Tokyo (JP); Toshihiro Shiotsuki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/044,525

(22) Filed: Mar. 9, 2011

(65) Prior Publication Data

US 2011/0159641 A1 Jun. 30, 2011

Related U.S. Application Data

(63) Continuation of application No. 12/846,616, filed on Jul. 29, 2010, now Pat. No. 7,923,292, which is a continuation of application No. 11/851,982, filed on Sep. 7, 2007, now Pat. No. 7,795,741.

(30) Foreign Application Priority Data

Sep. 21, 2006 (JP) .................................. 2006-255548

(51) Int. Cl.
*H01L 21/60* (2006.01)
(52) U.S. Cl.
USPC ........... 438/109; 438/107; 438/108; 257/666; 257/E23.024
(58) Field of Classification Search
USPC ................. 257/666, E23.024; 438/107, 108, 438/109
See application file for complete search history.

(56) References Cited

U.S. PATENT DOCUMENTS

| 5,502,667 | A | 3/1996 | Bertin et al. |
| 5,604,377 | A | 2/1997 | Palagonia |

(Continued)

FOREIGN PATENT DOCUMENTS

| JP | 01-235363 | 9/1989 |
| JP | 08-288455 | 11/1996 |

(Continued)

OTHER PUBLICATIONS

Japanese Office Action dated Mar. 13, 2012 received in Japanese App. No. 2006-255548 (and English translation).

(Continued)

*Primary Examiner* — Matthew W Such
*Assistant Examiner* — David Spalla
(74) *Attorney, Agent, or Firm* — Miles & Stockbridge P.C.

(57) ABSTRACT

The reliability of the semiconductor device which has the structure which stores a plurality of semiconductor chips with which plane sizes differ in the same sealing body in the state where they are accumulated via the insulating film which has adhesive property is improved.

In the semiconductor device which has the structure which stores a plurality of semiconductor chips with which plane sizes differ in the same sealing body in the state where they are accumulated via DAF, thickness of DAF of the back surface of the uppermost semiconductor chip with which the control circuit was formed was made thicker than each of DAF of the back surface of the lower layer semiconductor chip with which the memory circuit was formed. Hereby, the defect that the bonding wire which connects the uppermost semiconductor chip and a wiring substrate contacts the main surface corner part of a lower layer semiconductor chip can be reduced.

2 Claims, 15 Drawing Sheets

(56) References Cited

U.S. PATENT DOCUMENTS

| | | | |
|---|---|---|---|
| 6,431,456 B2 | 8/2002 | Nishizawa et al. | |
| 6,472,747 B2 | 8/2002 | Bazarjani et al. | |
| 6,538,331 B2 | 3/2003 | Masuda et al. | |
| 6,569,709 B2 | 5/2003 | Derderian | |
| 6,573,567 B1 | 6/2003 | Nishizawa et al. | |
| 6,753,613 B2 | 6/2004 | Levardo et al. | |
| 7,061,785 B2 | 6/2006 | Miwa et al. | |
| 7,084,514 B2 * | 8/2006 | Corisis et al. | 257/777 |
| 7,122,447 B2 | 10/2006 | Abe | |
| 7,378,725 B2 | 5/2008 | Sahaida et al. | |
| 7,518,250 B2 * | 4/2009 | Shimanuki | 257/784 |
| 2002/0151103 A1 | 10/2002 | Nakamura et al. | |
| 2004/0007782 A1 | 1/2004 | Hedler et al. | |
| 2004/0140552 A1 | 7/2004 | Kuroda et al. | |
| 2005/0085015 A1 | 4/2005 | Farrar | |
| 2006/0103620 A1 | 5/2006 | Joo et al. | |
| 2006/0267925 A1 | 11/2006 | Sakamaki et al. | |
| 2007/0170573 A1 | 7/2007 | Kuroda et al. | |
| 2007/0278639 A1 | 12/2007 | Bauer et al. | |

FOREIGN PATENT DOCUMENTS

| | | |
|---|---|---|
| JP | 2001-094046 A | 4/2001 |
| JP | 2001-217383 | 8/2001 |
| JP | 2004-071838 | 3/2004 |
| JP | 2004-072009 | 3/2004 |
| JP | 2004-146645 A | 5/2004 |
| JP | 2004-523912 | 8/2004 |
| JP | 2006-146220 A | 6/2006 |
| JP | 2006-164302 | 6/2006 |
| JP | 2006-330551 A | 12/2006 |
| TW | 495953 B | 7/2002 |
| TW | 200623291 A | 7/2006 |

OTHER PUBLICATIONS

Office Action issued Oct. 23, 2012 (and English translation thereof), received in Japanese Patent Application No. 2006-255548.

Japanese Office Action received in Japanese App. No. 2006-255548 (and English translation).

Japanese Office Action dated Apr. 2, 2013 issued in corresponding Japanese Patent Application No. 2006-255548 (and English Translation).

Taiwanese Office Action dated Apr. 15, 2013 (and English translation), issued in corresponding Taiwanese Patent Application No. 096124032.

* cited by examiner

METHOD OF MANUFACTURING SEMICONDUCTOR DEVICE

CROSS-REFERENCE TO RELATED APPLICATIONS

This application is a continuation of application Ser. No. 12/846,616 filed Jul. 29, 2010, now U.S. Pat. No. 7,923,292 which is a continuation of application Ser. No. 11/851,982 filed Sep. 7, 2007, now U.S. Pat. No. 7,795,741 and also claims priority from Japanese patent application No. 2006-255548 filed Sep. 21, 2006, the contents of which are hereby incorporated by reference into this application.

FIELD OF THE INVENTION

The present invention relates to semiconductor device technology, and particularly relates to an effective technology in the application to the semiconductor device which has the structure which stores a plurality of semiconductor chips with which plane sizes differ in the same sealing body in the state where they are accumulated.

DESCRIPTION OF THE BACKGROUND ART

There is a semiconductor device which stores the semiconductor chip for memory circuits, and the semiconductor chip for control circuits which controls the operation in one sealing body, and builds a desired system.

In the semiconductor device of this structure, the miniaturization of the semiconductor device is aimed at by mounting the semiconductor chip for memory circuits, and the semiconductor chip for control circuits in the state where they are accumulated, on a wiring substrate. In this case, generally, since the plane size is larger than the semiconductor chip for the control circuits from a viewpoint of aiming at increase of a storage capacity, in the semiconductor chip for memory circuits, the semiconductor chip for control circuits is accumulated on the semiconductor chip for memory circuits.

The lower layer semiconductor chip for memory circuits is mounted on the wiring substrate via the die attach film (Die Attach Film: abbreviate to DAF hereafter). The electrode of this semiconductor chip for memory circuits is electrically connected to the electrode of a wiring substrate through the bonding wire. The upper semiconductor chip for control circuits is mounted on the semiconductor chip for memory circuits via DAF. The electrode of this semiconductor chip for control circuits is electrically connected to the electrode of a wiring substrate through the bonding wire.

About this kind of semiconductor device, Japanese Unexamined Patent Publication No. 2004-146645 (Patent Reference 1) has a description, for example. The technology which laminates a plurality of semiconductor chips via DAF is disclosed by the FIG. 21 and FIG. 22 of this Patent Reference 1.
[Patent Reference 1] Japanese Unexamined Patent Publication No. 2004-146645 (FIG. 21, FIG. 22, etc.)

SUMMARY OF THE INVENTION

However, in the above-mentioned semiconductor device, the present inventor found out that the following problems occurred.

Since the plane size of the upper semiconductor chip for control circuits is smaller than the plane size of lower layer semiconductor chip for memory circuits, when the electrode of the semiconductor chip for control circuits and the electrode of a wiring substrate are electrically joined via a bonding wire with a forward bonding method (method which makes the semiconductor chip side the first bonding point, and makes the wiring substrate side the second bonding point), the bonding wire may contact the upper surface side periphery edge of lower layer semiconductor chip for memory circuits. Also in the semiconductor device disclosed by above-mentioned Patent Reference 1, a semiconductor chip is only laminated only via DAF, and the problem that a part of bonding wire contacts a part of lower layer semiconductor chips cannot be avoided.

Here, when bringing and arranging the semiconductor chip for control circuits close to the periphery of the semiconductor chip for memory circuits as much as possible, the trouble that the above-mentioned bonding wire contacts the semiconductor chip for memory circuits is avoidable. However, the junction of a bonding wire itself becomes difficult for the following reasons. The first reason is that for example, the loop of a bonding wire will become high when the semiconductor chip for control circuits is brought close to the periphery of the semiconductor chip for memory circuits. Regarding this cause, as shown in FIG. 19-FIG. 21, as for formation of bonding wire 50, after pulling out bonding wire 50 of length DB corresponding to gap DA of electrode 52 of semiconductor chip 51C, and electrode 54 of wiring substrate 53 from capillary 55 on electrode 52 of semiconductor chip 51C, capillary 55 is moved toward electrode 54 of wiring substrate 53 so that a locus may be drawn. Then, capillary 55 is made to glide over the surface of electrode 54 of wiring substrate 53, and bonding wire 50 is connected to electrode 54 of wiring substrate 53. That is, as shown in FIG. 21, when semiconductor chip 51C for control circuits is brought close to the periphery of semiconductor chip 51M for memory circuits, the distance of electrode 52 of semiconductor chip 51C and electrode 54 of wiring substrate 53 will become near. Therefore, it will be struck and taken down to the second bonding point in the state where the length of bonding wire 50 pulled out in the first bonding point is short. From this, a possibility that a part of bonding wire 50 will contact not only semiconductor chip 51M for memory circuits arranged at the lower row but the upper surface side periphery edge of semiconductor chip 51C for control circuits becomes high. Then, although what is necessary is just to pull out bonding wire 50 to long length in the first bonding point in order to avoid contact with the edge part of each semiconductor chips 51C and 51M, in connection with this, a loop will be formed highly. And a part of the loop is transparent from a sealing body, and it is visible, or exposes. The second reason is that when the semiconductor chip for control circuits is brought close to the periphery of the semiconductor chip for memory circuits too much for example, since the locus of striking and taking down from first junction to second junction of a bonding wire becomes steep too much and junction at the second junction becomes difficult, the loop shape of the wire becomes difficult to be stabilized. The third reason is that for example, the degree of incident angle of the bonding wire when seeing at a plane becomes a steep acute angle according as the semiconductor chip for control circuits is brought close to the periphery of the semiconductor chip for memory circuits. That is, since a bonding wire will be formed in a direction almost parallel to one side of the target semiconductor chip in which the electrode was formed, the gap of the adjoining bonding wire becomes narrow and it becomes easy to generate the short circuit defect of bonding wires.

When the bonding method of the above-mentioned bonding wire is made into a reverse bonding method (method which makes the electrode of a wiring substrate the first bonding point, and makes the electrode of a semiconductor chip the second bonding point) opposite to the above-mentioned forward bonding on the other hand, since the margin between a bonding wire, and lower layer semiconductor chip for memory circuits can be earned, the trouble that a bonding wire contacts the semiconductor chip for memory circuits is avoidable. However, before a wire-bonding step, a gold bump must be formed in the second junction side (electrode of the semiconductor chip for control circuits), the assembly time and assembly efficiency of a semiconductor device fall, and the problem that the manufacturing cost of a semiconductor device increases occurs.

Then, a purpose of the present invention is to offer the technology which can improve the reliability of the semiconductor device which has the structure which stores a plurality of semiconductor chips with which plane sizes differ in the same sealing body in the state where they are accumulated via the insulating film which has adhesive property.

The above-described and the other purposes and novel features of the present invention will become apparent from the description herein and accompanying drawings.

Of the inventions disclosed in the present application, typical ones will next be summarized briefly.

Namely, the present invention comprises the first semiconductor chip mounted via the first insulating film which has adhesive property over the wiring substrate, and the second semiconductor chip which is a semiconductor chip whose plane size is smaller than the first semiconductor chip, and was accumulated via the second insulating film which has adhesive property over the first semiconductor chip, wherein the thickness of the second insulating film is formed more thickly than the first insulating film.

Advantages achieved by some of the most typical aspects of the invention disclosed in the present application will be briefly described below.

That is, the reliability of a semiconductor device can be improved by forming the thickness of the second insulating film more thickly than the thickness of the first insulating film.

DETAILED DESCRIPTION OF THE PREFERRED EMBODIMENTS

Figure 1:
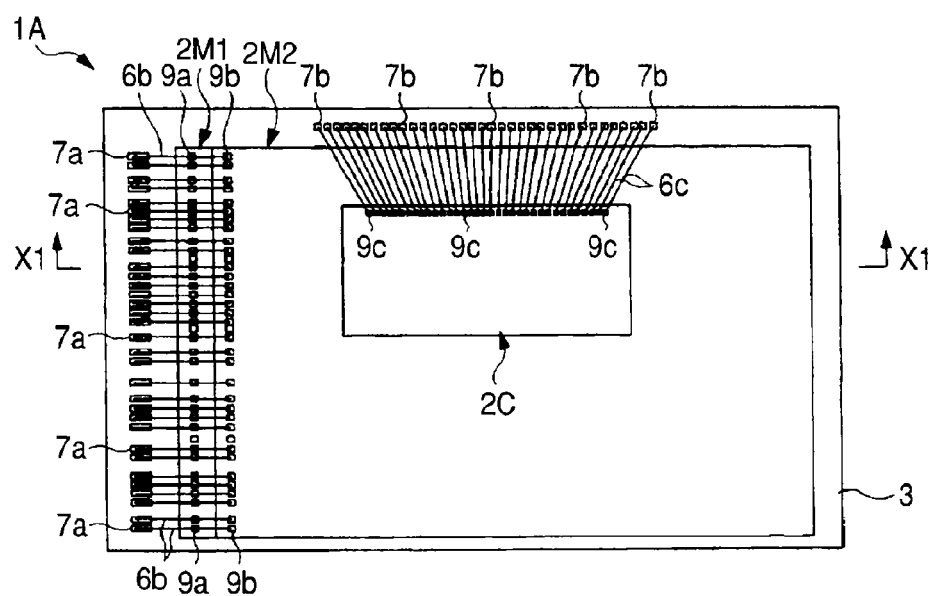
FIG. 1 is a plan view of the semiconductor device which is the 1 embodiment of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Further, in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range. And, in all the drawings for describing the embodiments, members of a like function will be identified by like reference numerals and overlapping descriptions will be omitted as much as possible. Hereafter, embodiments of the invention are explained in detail based on drawings.

Embodiment 1

Figure 2:
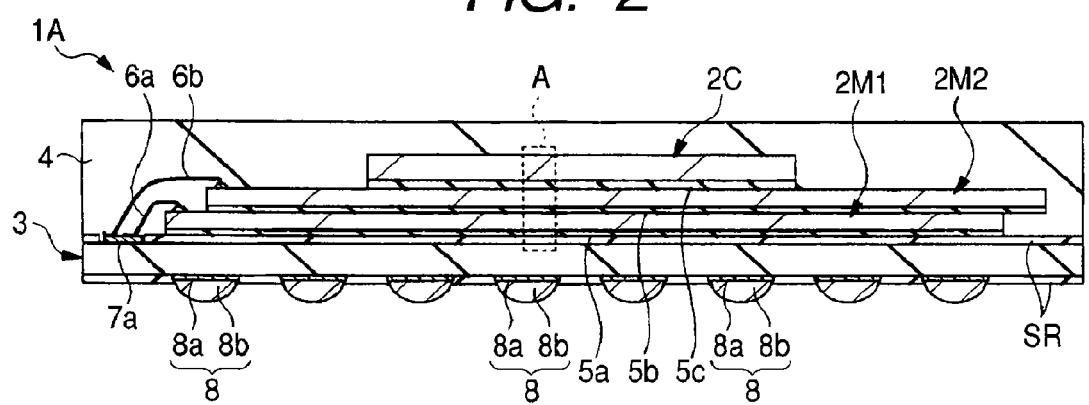
FIG. 2 is a cross-sectional view of X1-X1 line of FIG. 1.
Figure 3:
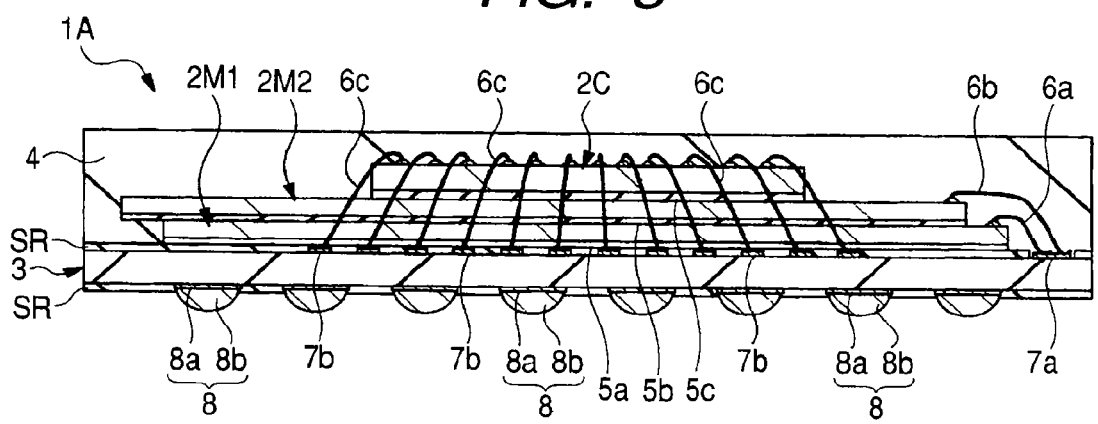
FIG. 3 is a cross-sectional view of X1-X1 line of FIG. 1, and is a cross-sectional view at the time of seeing from a direction opposite to the arrow of X1-X1 line.
Figure 4:
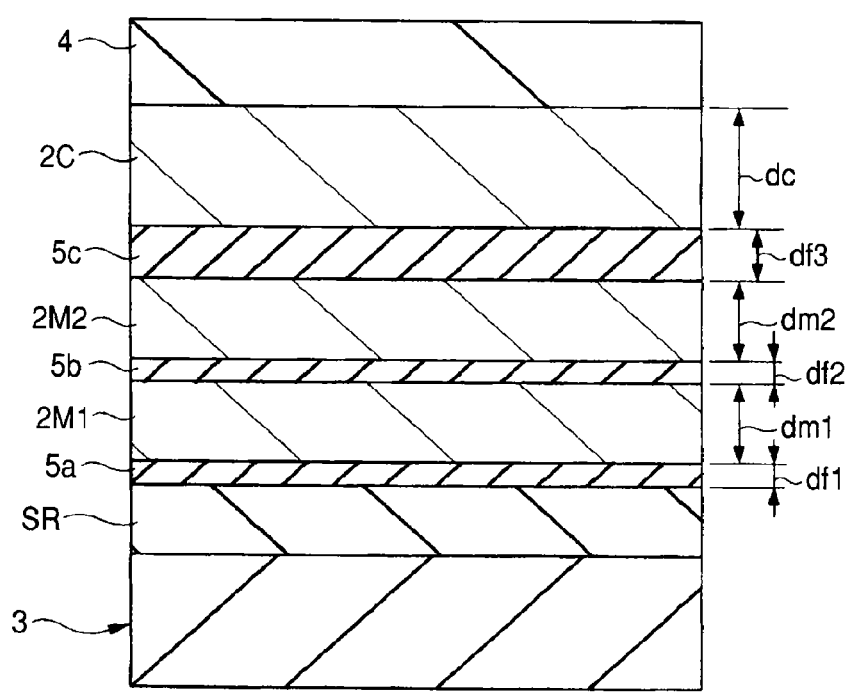
FIG. 4 is an enlarged sectional view of region A of FIG. 2.
Figure 5A:
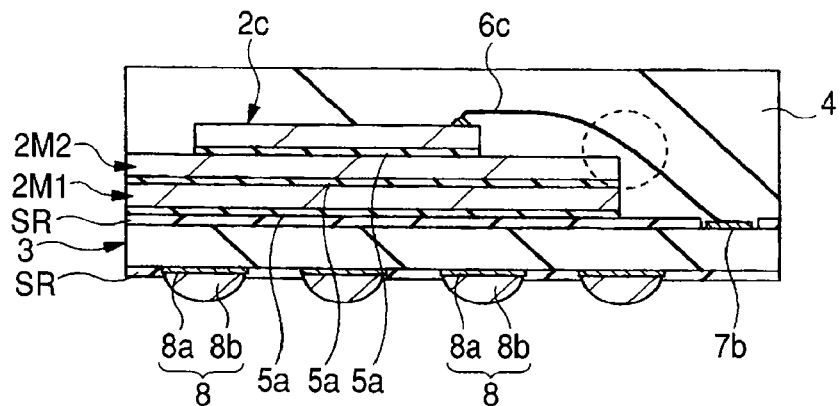
FIG. 5A is a principal part cross-sectional view of the semiconductor device which the present inventor examined.
Figure 5B:
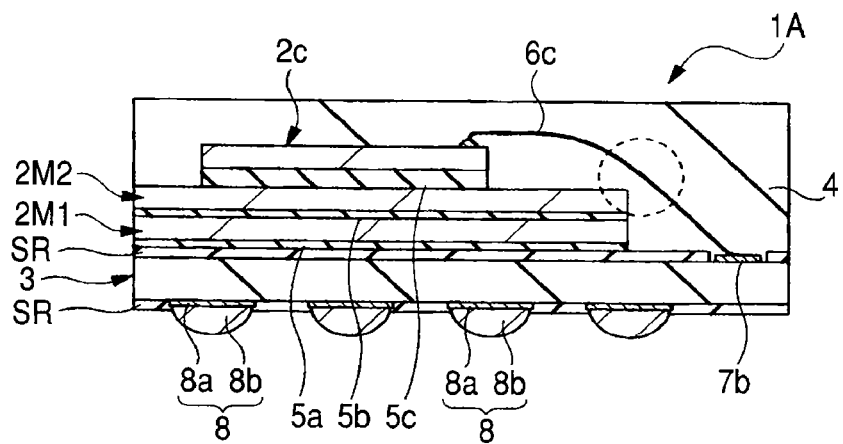
FIG. 5B is a principal part cross-sectional view of the semiconductor device which is the embodiment of the present invention.

FIG. 1 is a plan view of the semiconductor device of Embodiment 1, FIG. 2 is a cross-sectional view of X1-X1 line of FIG. 1, FIG. 3 is a cross-sectional view of X1-X1 line of FIG. 1, and is a cross-sectional view at the time of seeing from a direction opposite to the arrow of X1-X1 line, FIG. 4 is an enlarged sectional view of region A of FIG. 2, FIG. 5A is a principal part cross-sectional view of the semiconductor device which the present inventor examined, and FIG. 5B is a principal part cross-sectional view of the semiconductor device of Embodiment 1.

In FIG. 1, in order to make the internal configuration of a semiconductor device legible, the sealing body is removed. And, in FIG. 3, in order to make structure of a semiconductor device intelligible, the bonding wire which does not intersect X1-X1 line is also shown.

Semiconductor device 1A of Embodiment 1 is a semiconductor device of the CSP (Chip Size Package) structure which stored semiconductor chips 2M1 and 2M2 for memory circuits and semiconductor chip 2C for control circuits which controls the operation in the same sealing body 4 in the state where they are accumulated on the main surface of wiring substrate 3, and built the memory system as a whole. Semiconductor device 1A of this embodiment is used for example, the mobile computing devices to which thickness reduction and a miniaturization are required, the control machinery for hard disks, or the memory card of a controller built-in type.

As an adhesion member of each semiconductor chip 2M1, 2M2, and 2C, DAF (Die Attach Film) 5a-5c are used. Although paste material may be used as this adhesion member, in Embodiment 1, DAF is used from the following reasons.

The 1st is because it is convenient when securing the die strength of a semiconductor chip. Since a semiconductor chip is becoming still thinner in recent years, it has been an important problem how the die strength of a semiconductor chip is secured. In the case of DAF, it can be stuck on the back surface in the stage of a thin semiconductor wafer, and it is convenient for protecting a thin semiconductor chip in the transportation step and dicing step of a thin semiconductor wafer, the transportation step (pickup) of each semiconductor chip, etc.

The 2nd is because the side of DAF is made more thinly than insulated paste material, so it is convenient for making thin the total thickness of semiconductor device 1A. In recent years, since reduction in size, weight and thickness is demanded, with the structure which laminates the semiconductor chip of two or more sheets, the one of a semiconductor device where the thickness of an adhesion member is thinner is preferred.

The 3rd is because the uniformity of thickness is higher than insulated paste material, so DAF can deal with to increase of the area of a semiconductor chip. When the area of a semiconductor chip increases in the case of paste material, it is difficult to secure thickness uniformly in the surface, and a semiconductor chip may incline. On the other hand, in the case of DAF, since the uniformity of thickness is high, even if the area of a semiconductor chip increases, the flatness of a semiconductor chip is securable.

The 4th is because DAF can adhere at low temperature rather than paste material. In order to harden paste material in the case of paste material, a certain amount of heat treatment is required after mounting a semiconductor chip in wiring substrate 3. Therefore, wiring substrate 3 may warp with the heat, and the trouble of being unable to transport wiring substrate 3 well may occur. On the other hand, in the case of DAF, it can be adhered at low temperature, a warp of wiring substrate 3 can be suppressed or prevented, and the trouble of being unable to transport wiring substrate 3 can be avoided.

The 5th is because the plane position accuracy of a semiconductor chip is high. In the case of paste material, the plane position of a semiconductor chip may shift a little at the time of adhesion of a semiconductor chip. On the other hand, in the case of DAF, a drift does not happen in the plane position of a semiconductor chip at the time of adhesion of a semiconductor chip.

Each semiconductor chip 2M1, 2M2, and 2C are electrically connected to the wiring of wiring substrate 3 through bonding wires (only henceforth a wire) 6a-6c of a forward bonding method, respectively. A forward bonding method is a method which performs the first bonding of a wire (first bond) to the bonding pad (only henceforth a pad) of a semiconductor chip, and performs the bonding performed next to the first bonding of a wire (second bond) to the electrode of a wiring substrate. Since it is necessary to form a gold bump in the pad of the semiconductor chip at the side of a second bond part in the case of a reverse-bonding method opposite to a forward bonding method, we are anxious about increase of a manufacturing process and cost. On the other hand, since the step which forms a gold bump in the pad of a semiconductor chip can be skipped by adopting a forward bonding method in Embodiment 1, the manufacturing process of semiconductor device 1A can be reduced, and the cost of semiconductor device 1A can be reduced.

Such semiconductor chips 2M1, 2M2 and 2C, DAF 5a-5c, and wires 6a-6c are covered with and sealed by sealing body 4. Sealing body 4 is formed, for example with epoxy system resin.

The above-mentioned wiring substrate (chip mounting member) 3 consists of a thin plate of the plane rectangular form formed with for example, the printed-circuit board which uses glass epoxy resin as an insulating base material, and has the main surface (the second main surface) and back surface (the first main surface) which are mutually located in the opposite side along the thickness direction.

Solder-resist SR is formed in the main surface and back surface of this wiring substrate 3. Solder-resist SR has a function which makes the main surface and back surface of wiring substrate 3 flatter other than the function which prevents solder contacting the conductor pattern (a wiring and an electrode) which does not need soldering, and deterioration prevention functions of a conductor pattern etc. by humidity or contamination. As a method of making flat the main surface and back surface of wiring substrate 3, for example, there are a method of putting pressure and making the front surface of solder-resist SR flat before heat-curing processing of solder-resist SR, and the method of applying solder-resist SR twice, and making the front surface of solder-resist SR flat.

The main surface of wiring substrate 3 is a surface in which the above-mentioned semiconductor chip 2M1, 2M2, and 2C are mounted. In the main surface of this wiring substrate 3, a plurality of electrodes 7a and 7b are arranged. A plurality of electrodes 7a are arranged along the short side and near the short side of one side of wiring substrate 3. A plurality of electrodes 7b are arranged along the long side and near the long side of one side of wiring substrate 3.

On the other hand, the back surface of wiring substrate 3 is a surface opposite to the wiring substrate in which semiconductor device 1A is mounted. In the back surface of this wiring substrate 3, a plurality of bump electrodes 8 are arranged in the state where they were exposed from the above-mentioned solder-resist SR at matrix form. Each bump electrode 8 has electrode 8a formed in the back surface of wiring substrate 3, and bump part 8b joined to this. Electrode 8a is formed, for example with copper. Bump part 8b is formed, for example with lead free solder, such as tin (Sn)-silver (Ag)-copper, tin-silver-copper-antimony (Sb), and tin-copper. This bump electrode 8 (electrode 8a) is electrically connected to the above-mentioned electrodes 7a and 7b through the internal wiring of wiring substrate 3.

Above semiconductor chip (first semiconductor chip) 2M1 of an undermost layer is formed by for example, the semiconductor thin plate of the plane rectangular form which consists of a silicon (Si) single crystal, and it is adhered and fixed on the main surface (the second main surface) of wiring substrate 3 by DAF 5a.

Near the one-sided short side of this semiconductor chip 2M1, along the short side of semiconductor chip 2M1, a plurality of pads 9a are located and arranged in a line. Pad 9a is formed, for example with aluminum (Al) or an aluminum alloy. A plurality of pads 9a of this semiconductor chip 2M1 are electrically connected to electrode 7a of wiring substrate 3 via a plurality of wires (first bonding wire) 6a of a forward bonding method. Wire 6a is formed, for example with gold (Au).

On this main surface of semiconductor chip 2M1, semiconductor chip (first semiconductor chip) 2M2 is adhered and fixed by DAF 5b. This semiconductor chip 2M2 is formed by the semiconductor thin plate of the plane rectangular form which consists of a silicon single crystal, for example, and it is arranged so that it may hang on the main surface of lower layer semiconductor chip 2M1 in the state which adjusted long-side direction and a width direction with lower layer semiconductor chip 2M1, and in the state where it shifted to the long-side direction of semiconductor chip 2M1 to which a plurality of pads 9a of lower layer semiconductor chip 2M1 are exposed.

A plurality of pads 9b are arranged near the one-sided short side of this semiconductor chip 2M2 and along the short side of semiconductor chip 2M2. This pad 9b is also formed, for example with aluminum or an aluminum alloy. A plurality of pads 9b of this semiconductor chip 2M2 are electrically connected to electrode 7a of wiring substrate 3 via a plurality of wires (first bonding wire) 6b of a forward bonding method. Wire 6b is also formed, for example with gold.

These semiconductor chips 2M1 and 2M2 of two sheets are formed with mutually the same size (vertical, width, and thickness dm1, dm2). The flash memory (for example, 4 GB (giga byte) of Assist Gate AND type flash memory) of the same storage capacity is formed in each main surface. Each thickness dm1 and dm2 of semiconductor chips 2M1 and 2M2 is about 80-90 μm, for example. The working speed of a circuit can be improved by adopting an AND type memory.

Here, generally, while paste material is used in consideration of irregularity by a wiring and electrode of the main surface of wiring substrate 3 as an adhesion member which fixes semiconductor chip 2M1 to wiring substrate 3, DAF is used as an adhesion member which fixes semiconductor chip 2M2. However, when adhesion members differ in the same semiconductor chips 2M1 and 2M2, there is a problem that an assembly becomes complicated.

On the other hand, in Embodiment 1, the flatness of the main surface of wiring substrate 3 can be secured by solder-resist SR as mentioned above, and DAF 5a can be used as an adhesion member of semiconductor chip 2M1 of an undermost layer. That is, since the same DAF 5a and 5b can be used as an adhesion member of the same semiconductor chips 2M1 and 2M2, the assembly process of semiconductor device 1A can be simplified. Thickness df1 and df2 of such DAF 5a and 5b are equal, for example, it is about 10 μm.

On the main surface of above-mentioned semiconductor chip 2M2, semiconductor chip (second semiconductor chip) 2C is adhered and fixed by DAF 5c. This semiconductor chip 2C is formed by the semiconductor thin plate of the plane rectangular form which consists of a silicon single crystal, for example. The control circuit which controls operation of the memory circuit of the above-mentioned semiconductor chip 2M1 and 2M2 is formed in the main surface.

This semiconductor chip 2C is arranged in the main surface of semiconductor chip 2M2, where the long-side direction and the width direction are adjusted with lower layer semiconductor chip 2M2. Near the long side of one side of this semiconductor chip 2C, along the long side of semiconductor chip 2C, a plurality of pads 9c are arranged in a line. This pad 9c is also formed, for example with aluminum or an aluminum alloy. A plurality of pads 9c of this semiconductor chip 2C are electrically connected to electrode 7b of wiring substrate 3 via a plurality of wires (second bonding wire) 6c of a forward bonding method. Wire 6c is formed, for example with gold.

The plane size (vertical and width, area) of semiconductor chip 2C of this top layer is smaller than the plane sizes (vertical and width, area) of the above-mentioned semiconductor chip 2M1 and 2M2. For this reason, supposing it does not adopt a means at all, as shown in the portion enclosed with the dashed line of FIG. 5A, the problem of wire 6c approaching the main surface corner part of semiconductor chip 2M2, and contacting will occur. In FIG. 5A, the case where the thickness of semiconductor chip 2M1, 2M2, and 2C is equal, and the same DAF 5a is used as an adhesion member of each semiconductor chip 2M1, 2M2, and 2C is exemplified.

What is necessary is just to make high the height (the distance which separated from the main surface of wiring substrate 3 along the direction which intersects perpendicularly to the main surface) of the first bond of wire 6c as a measure for such a problem. Then, when procurement and standardization of a member are generally taken into consideration irrespective of a memory circuit or a control circuit, it is desirable to make thickness of DAF 5a-5c the same. However, in Embodiment 1, thickness df3 of DAF 5c of the back surface of semiconductor chip 2C was made thicker than thickness df1 and df2 of DAF 5a and 5b of the back surface of semiconductor chip 2M1 and 2M2. Thickness df3 of DAF 5c is about 25 μm, for example.

Thus, since the height of the first bond of wire 6c can be made high by having thickened thickness of DAF 5c, as shown in the portion enclosed with the dashed line of FIG. 5B, wire 6c can be separated from the main surface corner part of semiconductor chip 2M2 by that extent. For this reason, since the defective potential that wire 6c contacts the main surface corner part of semiconductor chip 2M2 can be reduced, the assembling property and reliability of semiconductor device 1A can be improved.

Since the loop of wire 6c does not become high by this structure, lack of hiding or exposure of wire 6c are not generated, either. Therefore, the yield of semiconductor device 1A can be improved. In FIG. 5B, the case where the thickness of semiconductor chips 2M1, 2M2, and 2C is equal is exemplified.

Here, it is, for example from the following reasons to have made thin DAF 5a and 5b of the back surface of semiconductor chips 2M1 and 2M2.

That is, when doing from a viewpoint of making high the height of the first bond of wire 6c, it will be thought that DAF 5a and 5b of the back surface of semiconductor chip 2M1 and 2M2 may be thickened. However, since the main surface of semiconductor chip 2M2 will also become high when DAF 5a and 5b are thickened, the defective potential that the above-mentioned wire 6c contacts the main surface corner part of semiconductor chip 2M2 increases. For this reason, DAF 5a and 5b of the back surface of semiconductor chip 2M1 and 2M2 are relatively made thin.

A memory is in the tendency of realization of high-capacity increasingly with multi-functionalization of electronic apparatus, such as mobile computing devices and digital appliances. Especially in order to correspond to this, it is necessary to accumulate the semiconductor chip for memory circuits in a multilayer. Here, in the decided thickness of semiconductor device 1A (thickness of sealing body 4), the actual condition tends to make thin fundamentally all the DAF 5a-5c, in order to realize multilayering of a semiconductor chip. On the other hand, in Embodiment 1, DAF 5c of the back surface of semiconductor chip 2C is thickened from a viewpoint of reducing the defect that wire 6c contacts the main surface corner part of semiconductor chip 2M2 as mentioned above. Then, it is made to make thin DAF 5a and 5b of the back surface of semiconductor chip for memory circuits 2M1, and 2M2 by that extent.

Further, making the semiconductor chip for memory circuits thin can accumulate a semiconductor chip in semiconductor device 1A more, and it leads to realization of high-capacity. However, the thickness of semiconductor chip for memory circuits 2M1 and 2M2 will reach a limit, when it takes into consideration securing the pickup nature (assembly yield) in the mounting step of a semiconductor chip. Therefore, it is better to make thin DAF 5a and 5b of the back surface of semiconductor chip for memory circuits 2M1 and 2M2.

Figure 6:
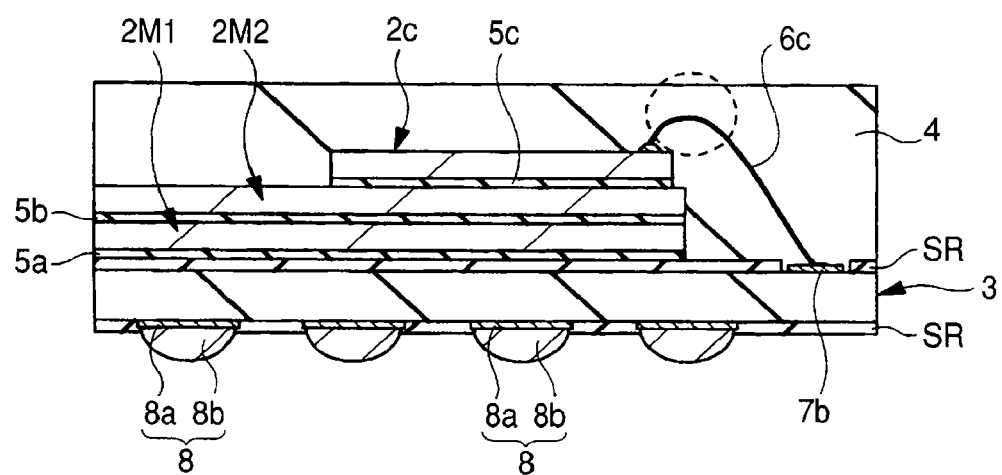
FIG. 6 is a principal part cross-sectional view of the semiconductor device which the present inventor examined.
Figure 7A:
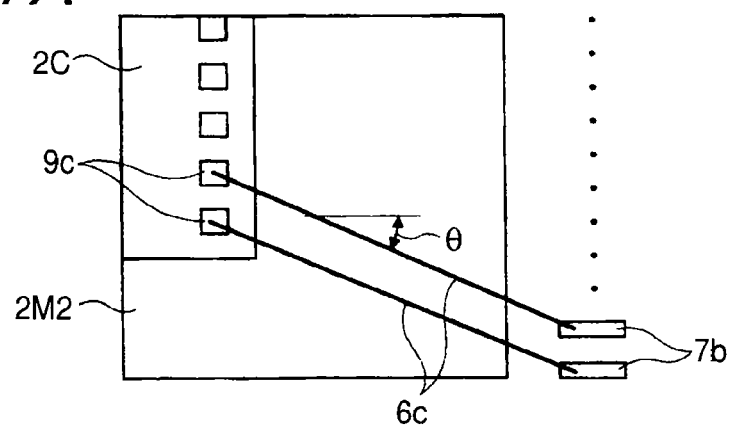
FIGS. 7A and 7B are the principal part plan views of a semiconductor device showing arrangement of the semiconductor chip of the top layer.
Figure 7B:
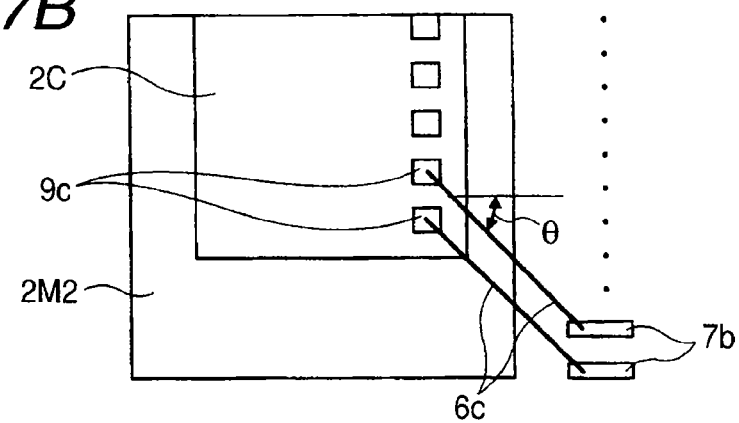

The above-mentioned semiconductor chip 2C of the top layer is arranged in the state that the main surface center has shifted from the main surface center of lower layer semiconductor chip 2M2 approaching to the one-sided long side of semiconductor chip 2M2. However, it is considered that semiconductor chip 2C does not approach too much the one-sided long side of lower layer semiconductor chip 2M2. FIG. 6 and FIGS. 7A and 7B explain the reason. FIG. 6 is a principal part cross-sectional view of the semiconductor device which the present inventor examined, and FIGS. 7A and 7B are the principal part plan views of a semiconductor device showing arrangement of semiconductor chip 2C of the top layer.

As shown in FIG. 6, when bringing semiconductor chip 2C close to the periphery of semiconductor chip 2M2 as much as possible and arranging it, the trouble that the above-mentioned wire 6c contacts semiconductor chip 2M2 is avoidable. However, in this case, the loop of wire 6c becomes high and there is a problem that it is transparent and visible or the loop part is exposed from sealing body 4. The locus of striking down from a first bond to a second bond of wire 6c becomes steep too much, and junction with a second bond becomes difficult. Wire bonding of the wire 6c of the arranging direction ends of a plurality of wires 6c comes to be aslant done by the time of seeing at a plane according as semiconductor chip 2C is brought close to the periphery of semiconductor chip 2M2, as shown in FIGS. 7A and 7B. However, since the degree θ of incident angle of the wire 6c becomes an acute angle, the gap of adjoining wire 6c becomes narrow, and it becomes easy to generate the short circuit defect of adjoining wire 6c.

Then, in Embodiment 1, semiconductor chip 2C is arranged, so that the lower layer one-sided long side of semiconductor chip 2M2 may not be approached too much. Hereby, since the gap of a first bond and a second bond of wire 6c can be set as a suitable distance, the loop height of wire 6c does not become high too much, and the locus of wire 6c does not become steep too much. The degree θ of incident angle of wire 6c does not become an acute angle too much. Therefore, the stability of wire 6c can be improved.

Electrode 7b to which semiconductor chip 2C is electrically connected through wire 6c is arranged to the long side of wiring substrate 3 in order to make wiring of a wiring easy in wiring substrate 3. It is also for avoiding it, since the size of the long-side direction of semiconductor device 1A will become longer and the plane size of semiconductor device 1A will become large, when electrode 7b to which wire 6c is connected is arranged to the short side of wiring substrate 3.

In Embodiment 1, thickness dc of semiconductor chip 2C is formed more thickly than thickness dm1 and dm2 of semiconductor chip 2M1 and 2M2. Thickness dc of semiconductor chip 2C is about 120-150 μm, for example.

The main reasons for thickening semiconductor chip 2C are for warp suppression of semiconductor device 1A. That is, when there are many amounts of sealing body (resin) 4 in semiconductor device 1A, by hardening contraction of sealing body 4, semiconductor device 1A may warp and it may become difficult to mount semiconductor device 1A. Then, in Embodiment 1, it is made to thicken semiconductor chip 2C. Hereby, the volume of the semiconductor chip in sealing body 4 can be increased, and the amount of sealing body (resin) 4 of semiconductor device 1A can be reduced. Hereby, a warp of semiconductor device 1A can be suppressed, and poor mounting of semiconductor device 1A can be reduced or prevented.

When only warp suppression is taken into consideration, thickening lower layer semiconductor chip 2M1 and 2M2 is also considered. However, when lower layer semiconductor chip 2M1 and 2M2 are thickened, the height of the main surface of semiconductor chip 2M2 will become high, and it will become easy to generate the above-mentioned contact failure of wire 6c, and the main surface corner part of semiconductor chip 2M2. In order to avoid the contact failure of the wire 6c, when the loop of wire 6c is made high, sealing body 4 will have to be thickened from a viewpoint of preventing lack of hiding and exposure of wire 6c, and semiconductor device 1A will become thick. In order to realize multilayering of a semiconductor chip in the decided thickness of semiconductor device 1A (thickness of sealing body 4) as mentioned above, the side which made thin semiconductor chip for memory circuits 2M1 and 2M2 to which multilayering becomes indispensable is preferred when realizing thickness reduction of semiconductor device 1A.

Then, in Embodiment 1, thickness of semiconductor chip 2C of the top layer is made thicker than the lower layer semiconductor chip 2M1 and 2M2. Hereby, a warp of semiconductor device 1A can be suppressed, without thickening semiconductor device 1A. Since the first bond point of semiconductor chip 2C becomes high by having made semiconductor chip 2C thicker than lower layer semiconductor chip 2M1 and 2M2, the defective potential that wire 6c contacts the main surface corner part of semiconductor chip 2M2 can be reduced further.

Here, the present inventor found out that the following new problems became remarkable for the first time, when semiconductor chip 2C was thickened.

The first problem is a problem of becoming easy to generate the chipping in the back surface of semiconductor chip 2C.

Since a hard thing and a soft thing will be simultaneously cut when dicing of the semiconductor wafer with DAF is done, it is easy to generate a chipping on the boundary (back surface side corner part of a semiconductor chip) of a semiconductor chip and DAF. Especially this poor chipping has the tendency to increase, according as a semiconductor wafer is thick. According to the analysis output of a present inventor, to a chipping seldom happening, when the thickness of a semiconductor wafer is about 90 μm, when the thickness of a semiconductor wafer becomes more than 150 μm, the chipping is increasing. When semiconductor chip 2C is accumulated on the main surface of semiconductor chip 2M2 after the waste silicon by such a chipping turned to the back surface of DAF 5c and has adhered to it from the back surface of semiconductor chip 2C, there is a problem that the waste silicon of the back surface of DAF 5c will damage the main surface of semiconductor chip 2M2.

On the other hand, according to Embodiment 1, by having thickened DAF 5c, even if a chipping occurs with the back surface of semiconductor chip 2C, it can be reduced or prevented that the waste silicon by the chipping turns to the back surface of DAF 5c. So, poor damage of the main surface of semiconductor chip 2M2 resulting from the waste silicon by a chipping can be reduced or prevented. According to the analyses of a present inventor, it turns out that it can be reduced that the above chipping waste turns to the back surface of DAF 5c by doing thickness of DAF 5c more than 20 µm.

Figure 8A:
FIGS. 8A and 8B are the cross-sectional views of a thin semiconductor chip and the mounting substrate on which this is mounted.
Figure 8B:
Figure 9A:
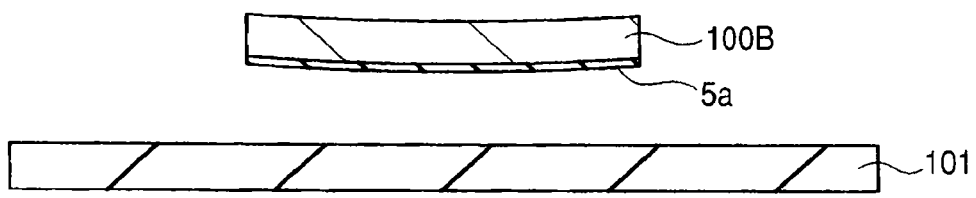
FIGS. 9A and 9B are the cross-sectional views of a thick semiconductor chip and the mounting substrate on which this is mounted.
Figure 9B:
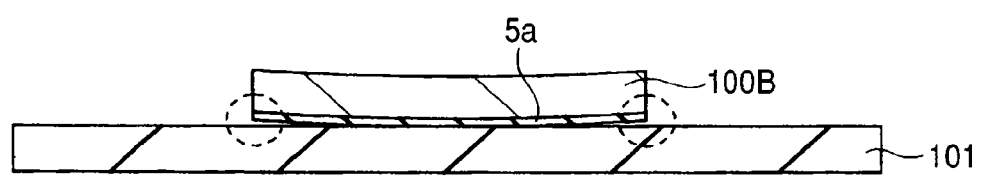
Figure 10:
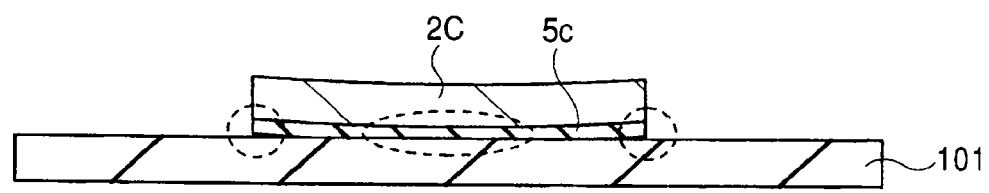
FIG. 10 is a cross-sectional view of semiconductor chip 2C and the mounting substrate on which this is mounted.

The second problem is a problem resulting from a warp of semiconductor chip 2C being unabsorbable. FIGS. 8A and 8B and FIGS. 9A and 9B explain this problem, and FIG. 10 explains the settlement result. FIGS. 8A and 8B show the cross-sectional view of thin semiconductor chip 100A and mounting substrate 101 in which this is mounted. FIGS. 9A and 9B show the cross-sectional view of semiconductor chip 100B thicker than the above-mentioned semiconductor chip 100A and mounting substrate 101 in which this is mounted. Thin DAF 5a is used for the adhesion member of semiconductor chips 100A and 100B by each. FIG. 10 shows the cross-sectional view of semiconductor chip 2C and mounting substrate 101 in which this is mounted.

As shown in FIG. 8A, when semiconductor chip 100A is thin, even if a warp has occurred in semiconductor chip 100A before mounting, since the rigidity is low, as shown in FIG. 8B, semiconductor chip 100A after mounting is mounted in the almost flat state along a mounting surface by the adhesive strength of DAF 5a.

However, as shown in FIG. 9A, when semiconductor chip 100B becomes thick, rigidity will become high so much and it will come to excel the adhesive strength of DAF 5a. So, as shown in FIG. 9B, semiconductor chip 100B is mounted in the state where it warped, and the clearance which has not been pasted up generates in the peripheral part (region enclosed with a dashed line) of semiconductor chip 100B. As a result, in the assembly process of semiconductor device 1A, with the above-mentioned clearance as the starting point, semiconductor chip 100B peels, or in a molding step, mold resin enters into the back surface side of semiconductor chip 100B from the above-mentioned clearance, and semiconductor chip 100B breaks.

On the other hand, by having thickened DAF 5c, as shown in FIG. 10, a warp of semiconductor chip 2C is absorbable according to Embodiment 1, with DAF 5c. Since adhesion area of semiconductor chip 2C and mounting substrate 101 (in Embodiment 1, it is equivalent to semiconductor chip 2M2) can be made wide, and the clearance between the peripheral parts (region enclosed with a dashed line) of semiconductor chip 2C can be reduced by this, peeling and the crack of semiconductor chip 2C can be reduced or prevented.

According to an experiment and the evaluation result of a present inventor, until 10 times of the thickness of DAF are suitable for the thickness of the semiconductor chip which applies DAF of thickness 10 µm, and when exceeding it, it is preferred to apply a thing thicker than 10 µm for the thickness of DAF. The reason which makes DAF of the thickness of 10 µm one standard originates in the flatness of the main surface of wiring substrate 3. Under the present circumstances, the flatness of the main surface of wiring substrate 3 is 3 µm, and is set to 5 µm as a coverage. Manufacturing variation of DAF thickness is made into ±2 µm. From this, a semiconductor chip is fixed to wiring substrate 3, and the DAF thickness considered as a level which is satisfactory in reliability is considered to be specification with thinnest about 10 µm.

Figure 11:
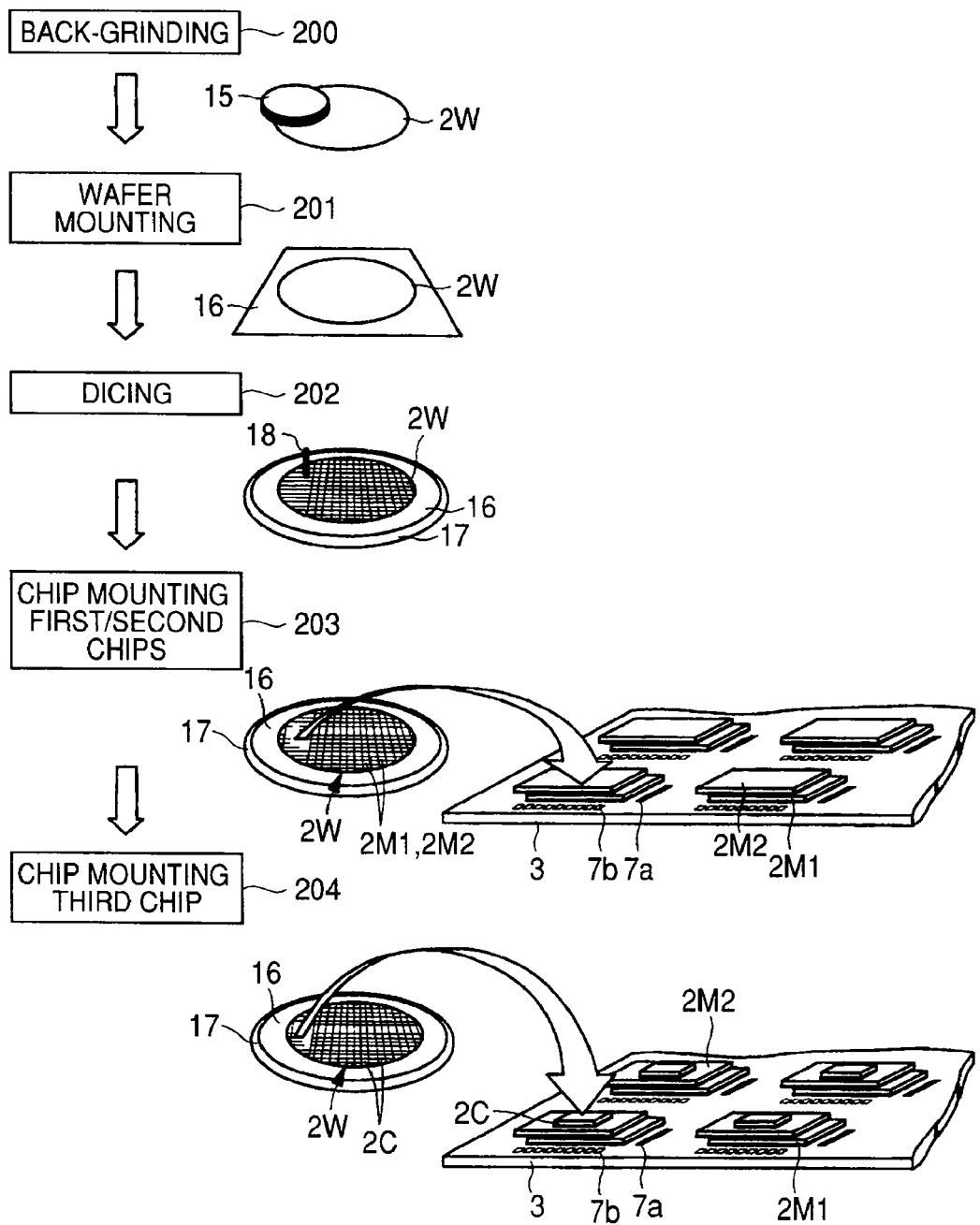
FIG. 11 is an explanatory diagram of an example of the manufacturing process of a semiconductor device which is the 1 embodiment of the present invention.
Figure 12:
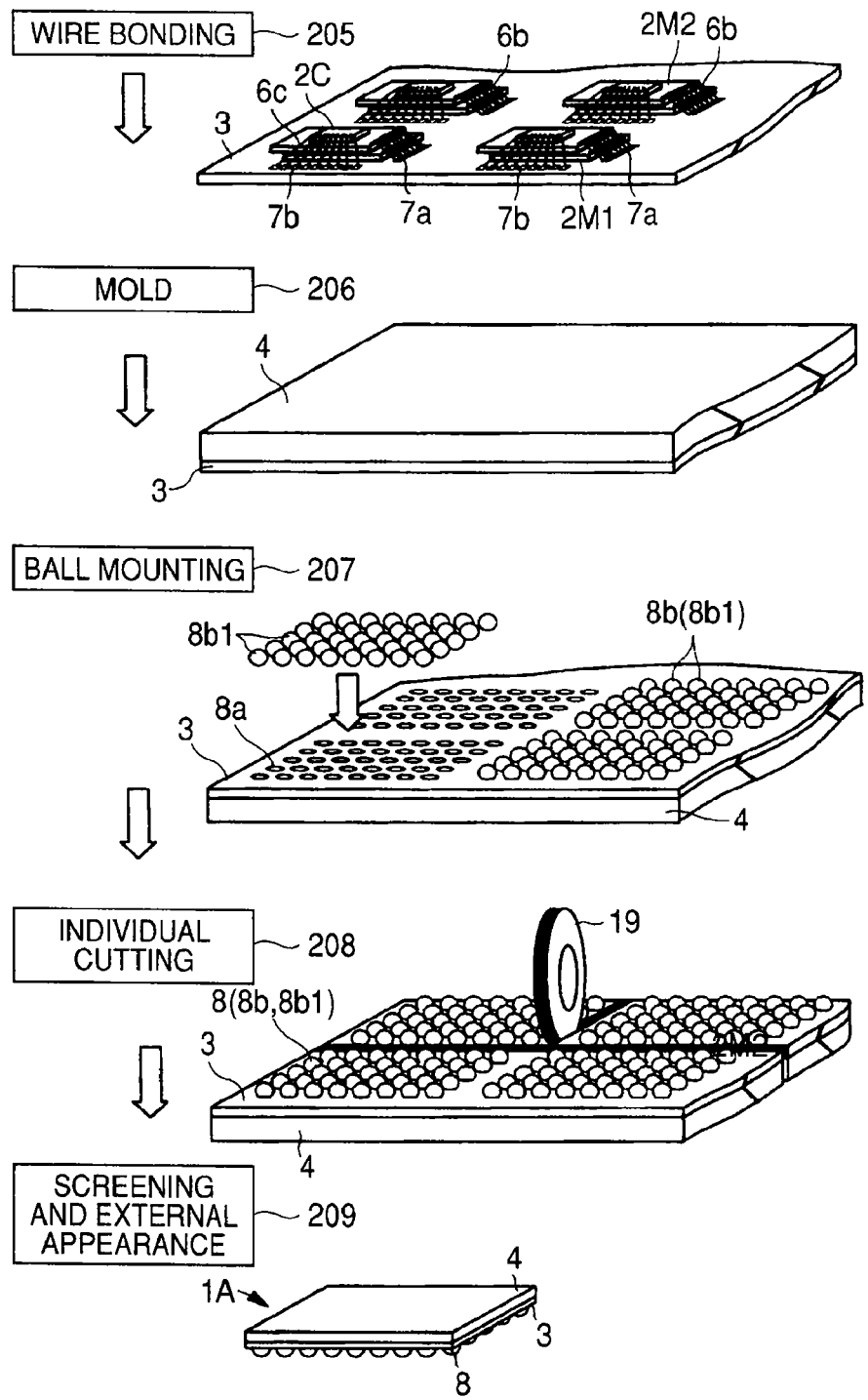
FIG. 12 is an explanatory diagram of an example of the manufacturing process of a semiconductor device following FIG. 11.

Next, FIG. 11 and FIG. 12 explain an example of the manufacturing method of semiconductor device 1A of Embodiment 1.

First, as shown in FIG. 11, the back surface of semiconductor wafer 2W after a wafer process is completed is ground with grinding wheel 15, and semiconductor wafer 2W is made into desired thickness (back-grinding step 200 of FIG. 11). Although semiconductor wafer 2W of one sheet is shown here, the above-mentioned semiconductor chip 2M1, 2M2, and the above-mentioned semiconductor chip 2C are formed in a separate semiconductor wafer, respectively. A polishing process and etching processing may be performed to the back surface of semiconductor wafer 2W after the back surface grinding step of semiconductor wafer 2W.

Then, the back surface of semiconductor wafer 2W is stuck on the DAF attachment surface of wafer sheet 16 (wafer mounting step 201 of FIG. 11). This wafer sheet 16 is a sheet of DAF/dicing film integral type with which DAF was stuck on the main surface of a dicing film. Semiconductor wafer 2W is mounted in wafer sheet 16, where it turned the main surface upwards and the back surface of semiconductor wafer 2W is directly stuck on DAF of the main surface of wafer sheet 16.

Then, after sticking on the main surface of wafer sheet 16 wafer ring 17 which encloses the periphery of semiconductor wafer 2W, semiconductor wafer 2W is transported to a dicing apparatus, and dicing processing is performed (dicing step 202 of FIG. 11). Dicing processing is a step which applies dicing blade 18 which does a high velocity revolution along the cutting plane line (borderline of a semiconductor chip) of semiconductor wafer 2W, cuts semiconductor wafer 2W, and divides into each semiconductor chip 2M1, 2M2, or semiconductor chip 2C.

Then, semiconductor chip 2M1 is picked up from semiconductor wafer 2W after a dicing step, and it mounts on the main surface of wiring substrate 3. At this time, adhesion fixing of semiconductor chip 2M1 is done to wiring substrate 3 by DAF 5a of the back surface. Wiring substrate 3 of this stage has structure which has a formation area of a plurality of semiconductor devices in one. Then, semiconductor chip 2M2 is picked up from the same semiconductor wafer 2W, and semiconductor chip 2M2 is mounted on the main surface of semiconductor chip 2M1. At this time, adhesion fixing of semiconductor chip 2M2 is done to semiconductor chip 2M1 by DAF 5b of the back surface (chip mounting step 203 of FIG. 11).

Here, since semiconductor chips 2M1 and 2M2 are the same memories, semiconductor chips 2M1 and 2M2 have been picked up from the same semiconductor wafer 2W. Hereby, the manufacturing process of a semiconductor device can be simplified. Since the memory whose characteristics resembled closely can be mounted, the performance of semiconductor device 1A can be improved. Semiconductor chips 2M1 and 2M2 may be picked up from a separate semiconductor wafer.

Then, semiconductor chip 2C is picked up from semiconductor wafer 2W after a dicing step, and it mounts on the main surface of semiconductor chip 2M2. At this time, adhesion fixing of the semiconductor chip 2C is done to semiconductor chip 2M2 by DAF 5c of the back surface (chip mounting step 204 of FIG. 11).

Then, as shown in FIG. 12, semiconductor chip 2M1, 2M2 and 2C on wiring substrate 3, and the electrode of wiring substrate 3 are connected with wires 6a, 6b, and 6c (wire-bonding step 205 of FIG. 12).

Then, semiconductor chips 2M1, 2M2 and 2C of a plurality of semiconductor device regions of the main surface of wiring substrate 3 after a wire-bonding step, wires 6a, 6b, and 6c, etc. are put in block and sealed by sealing body 4 formed with mold resin (molding step 206 of FIG. 12).

Then, wiring substrate 3 is turned and solder ball 8b1 formed with lead free solder is mounted on a plurality of electrodes 8a arranged at the back surface for every semiconductor device formation area of the back surface of wiring substrate 3. Then, bump part 8b is formed in electrode 8a by heat-treating (reflow heat-treatment) (ball mounting step 207 of FIG. 12).

Then, dicing blade 19 which does a high velocity revolution is applied and cuts from the back surface of wiring substrate 3 along the cutting plane line (borderline of semiconductor device 1A) of wiring substrate 3, and it divides into each semiconductor device 1A (individual cutting step 208 of FIG. 12).

Then, semiconductor device 1A is manufactured through a screening and visual inspection (step 209 of FIG. 12).

Embodiment 2

In the Embodiment 1, since it assumed applying semiconductor device 1A to the electronic apparatus by which high-speed operation is demanded, the case where the flash memory of semiconductor chip 2M1 and 2M2 was an AND type was explained. However, not the thing limited to this but a NAND type flash memory may be used.

Figure 13:
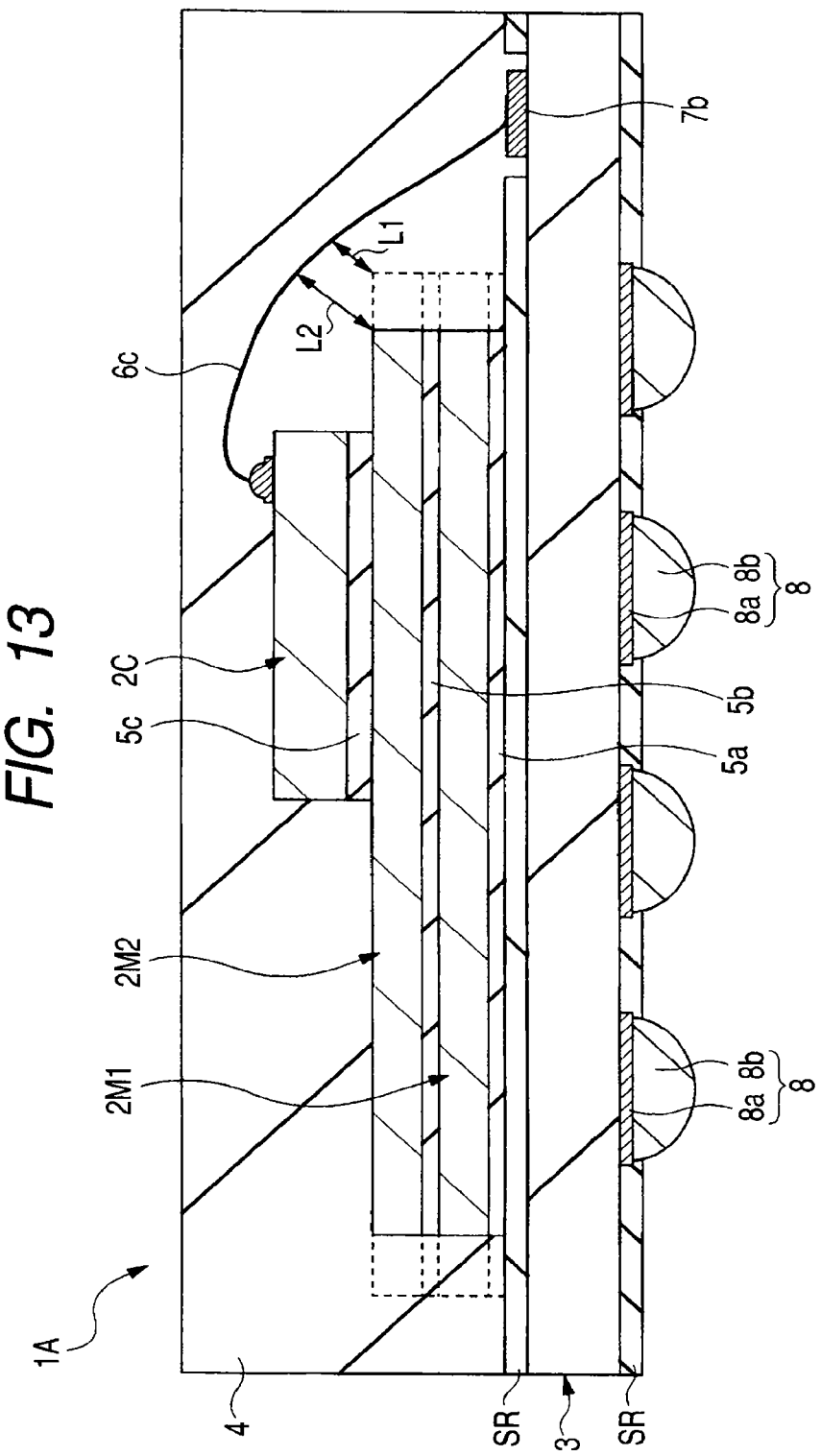
FIG. 13 is a principal part cross-sectional view of the semiconductor device which is another embodiment (Embodiment 2) of the present invention.

FIG. 13 is a principal part cross-sectional view of semiconductor device 1A of Embodiment 2. The dashed line shows semiconductor chip 2M1 and 2M2 in which the AND type flash memory of the case of the Embodiment 1 was formed. Distance L1 shows the distance from the main surface corner part of semiconductor chip 2M2 in which the AND type flash memory was formed to wire 6c.

In a NAND type case, the plane size of semiconductor chip 2M1 and 2M2 can be made smaller than an AND type (dashed line) case, and distance L2 from the main surface corner part of semiconductor chip 2M2 to wire 6c can be made longer than distance L1. For this reason, since the defective potential that wire 6c contacts the main surface corner part of semiconductor chip 2M2 can be reduced, the assembling property and reliability of semiconductor device 1A can be improved.

Embodiment 3

In the Embodiment 1 and 2, although the case where two semiconductor chips for memory circuits were accumulated was explained, it is not limited to this, and three or more pieces may be accumulated, for example, at least one piece is good.

Figure 14A:
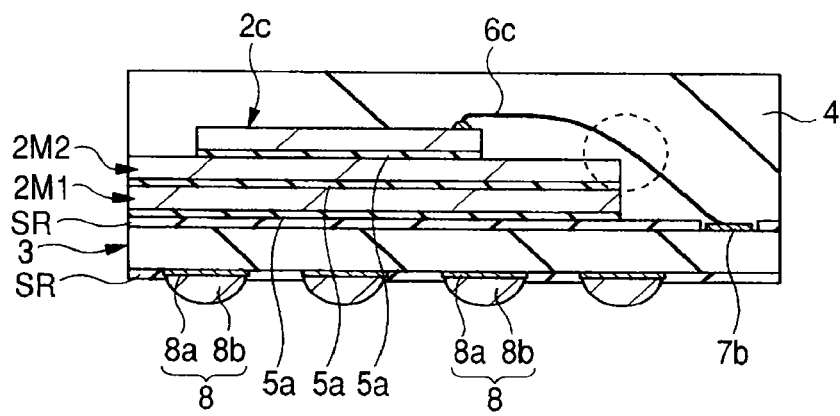
FIG. 14A is a principal part cross-sectional view of a semiconductor device in case the number of the semiconductor chips for memory circuits is two.
Figure 14B:
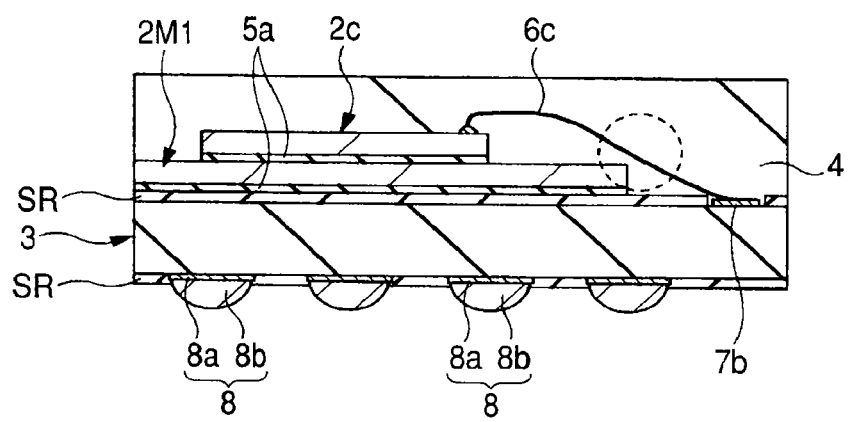
FIG. 14B is a principal part cross-sectional view of a semiconductor device in case the number of the semiconductor chips for memory circuits is one.

FIGS. 14A and 14B are the principal part cross-sectional views of the semiconductor device which the present inventor examined. FIG. 14A shows the case where semiconductor chips 2M1 and 2M2 for memory circuits are two pieces, and FIG. 14B shows the case where semiconductor chip 2M1 for memory circuits is one piece. As for DAF 5a of the back surface of semiconductor chip 2C, 2M1, and 2M2, as for all, the thing of the same thickness is used.

Since the height of the main surface of the semiconductor chip for memory circuits under semiconductor chip 2C for control circuits becomes low when the semiconductor chip for memory circuits is made into one piece in the structure of FIG. 14A, the defect that wire 6c contacts at the main surface corner part of the semiconductor chip for memory circuits under semiconductor chip 2C is considered not to be generated.

However, in practice, while the total thickness of a semiconductor device has the request of not changing, when the semiconductor chip for memory circuits is simply made into one piece, its amount of the semiconductor chip in semiconductor device 1A will decrease, and its amount of sealing body 4 (resin) will increase. Therefore, originating in hardening contraction of resin by the heat treatment in a manufacturing process, and the thermal expansion coefficient difference of a semiconductor chip and resin, semiconductor device 1A warps easily. Then, the actual condition reduces the amount of sealing body 4 (resin), and is trying to suppress or prevent a warp of semiconductor device 1A by making thickness of wiring substrate 3 thicker than the case of FIG. 14A, as shown in FIG. 14B.

However, since wire 6c must be formed in this case in the range of thin sealing body 4 (the range of a thickness direction), as shown in FIG. 14B, when a means is not adopted at all, the defective potential of wire 6c approaching and contacting the main surface corner part of semiconductor chip 2M1 for memory circuits will increase. Therefore, also when the semiconductor chip for memory circuits is made into one piece, it is preferred to make it be the same as that of the structure explained by the Embodiment 1.

Figure 15:
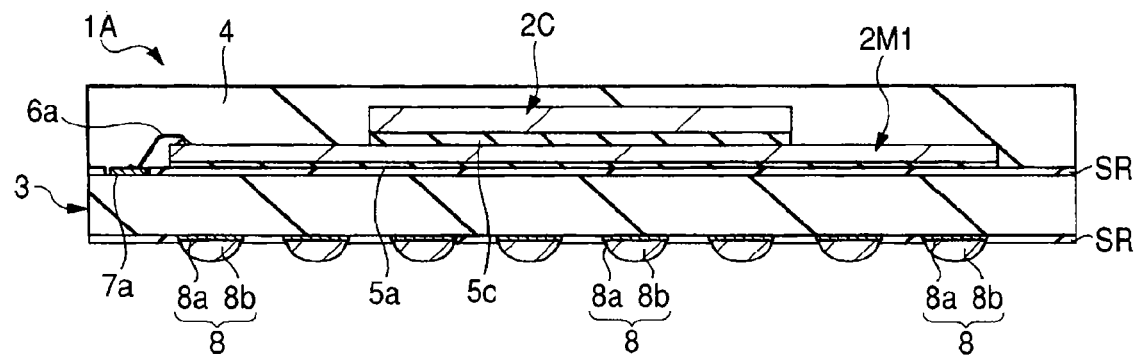
FIGS. 15 and 16 are principal part cross-sectional views of the semiconductor device which is another embodiment (Embodiment 3) of the present invention.
Figure 16:
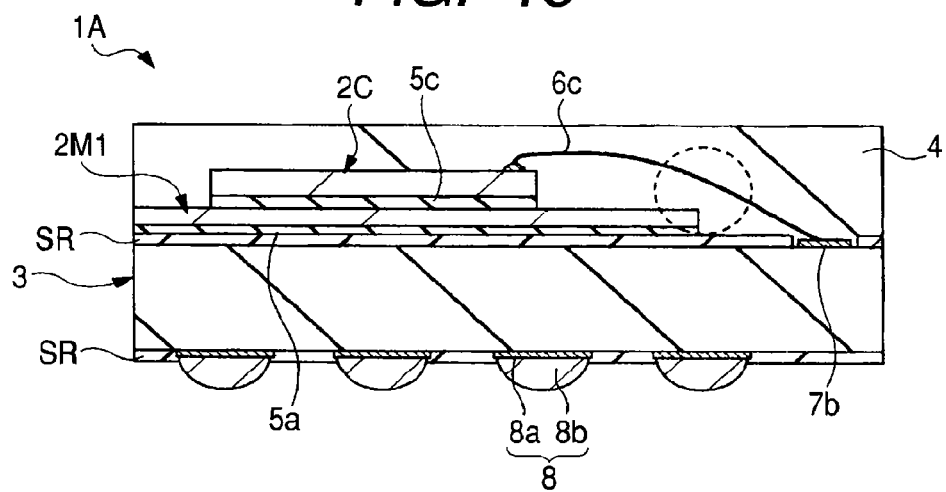

FIG. 15 and FIG. 16 show the principal part cross-sectional view of semiconductor device 1A of Embodiment 3. Semiconductor chip 2M1 for memory circuits is only one piece. The thickness of wiring substrate 3 is thicker than what was explained by the Embodiment 1. Hereby, since the amount of sealing body 4 (resin) can be reduced, a warp of semiconductor device 1A can be suppressed or prevented.

DAF 5c of the back surface of the upper semiconductor chip 2C for control circuits is formed more thickly than DAF 5a of the back surface of lower layer semiconductor chip 2M1 for memory circuits. Hereby, the defective potential that wire 6c contacts the main surface corner part of semiconductor chip 2M1 can be reduced like the Embodiment 1.

The thickness of the upper semiconductor chip 2C for control circuits is formed more thickly than lower layer semiconductor chip 2M1 for memory circuits. Hereby, the defective potential that wire 6c contacts the main surface corner part of semiconductor chip 2M1 can be further reduced like the Embodiment 1. Since the amount of sealing body 4 (resin) can be reduced by the part which thickened semiconductor chip 2C, a warp of semiconductor device 1A can be suppressed or prevented further.

Embodiment 4

Figure 17:
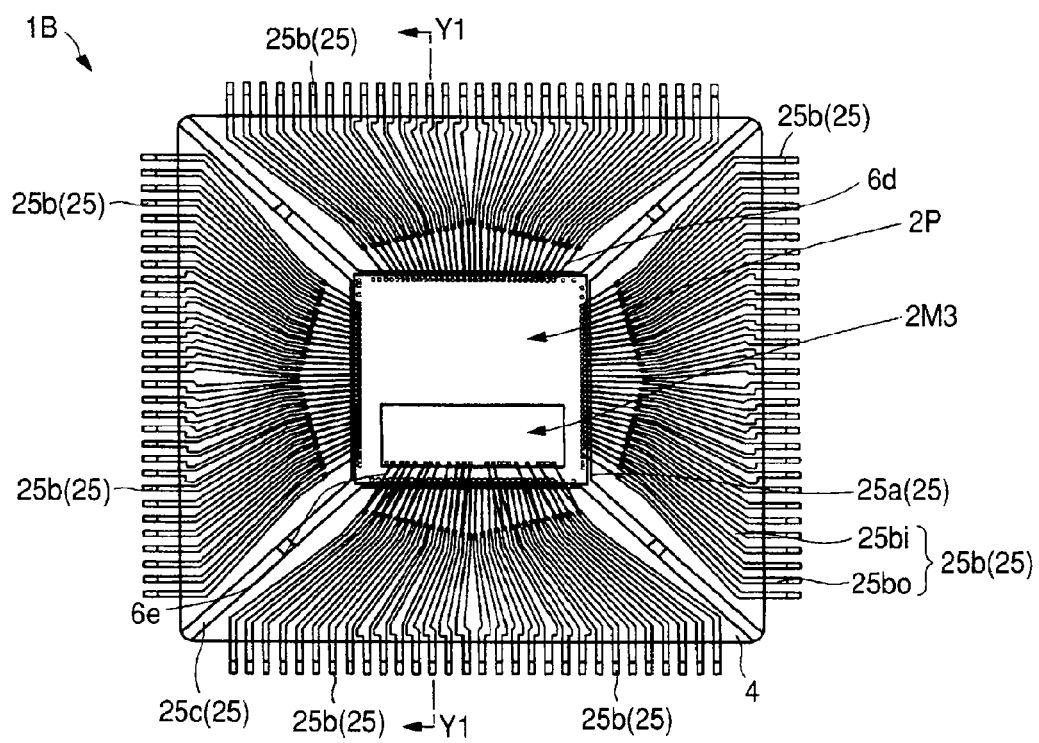
FIG. 17 is a plan view of the semiconductor device of another embodiment (Embodiment 4) of the present invention.
Figure 18:
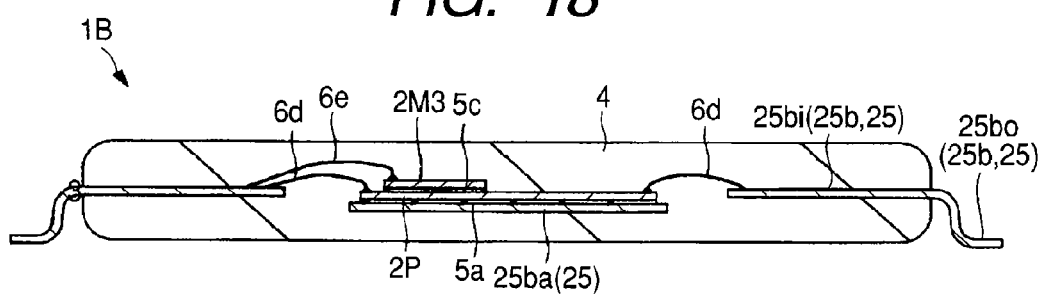
FIG. 18 is a cross-sectional view of Y1-Y1 line of FIG. 17.
Figure 19:
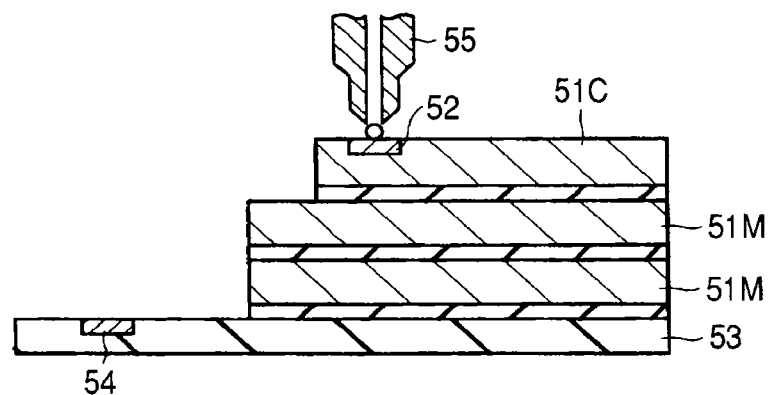
FIGS. 19 to 21 are explanatory diagrams of the bonding wire formation by a forward bonding method.
Figure 20:
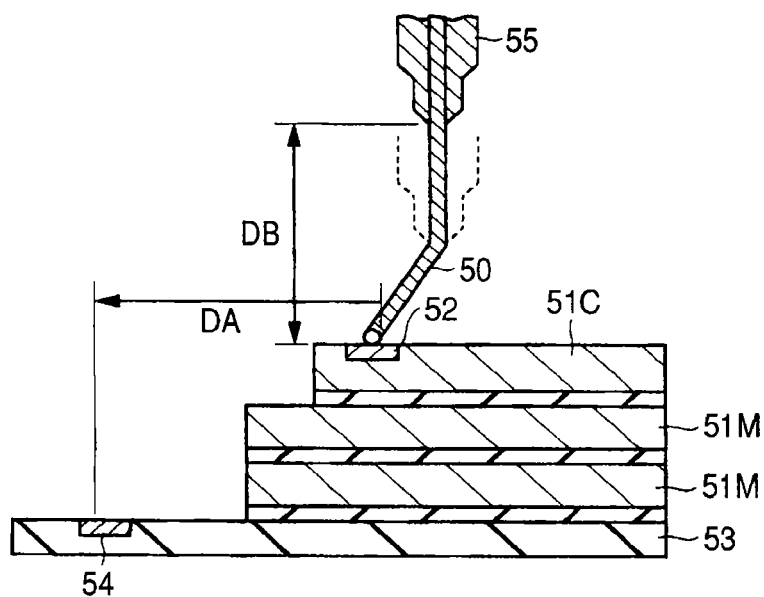
Figure 21:
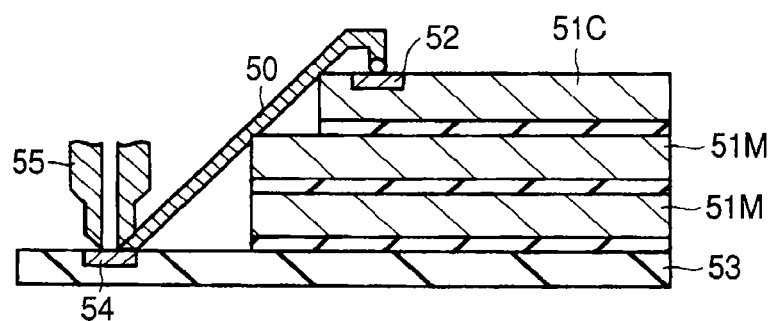

FIG. 17 is a plan view of the semiconductor device of Embodiment 4, and FIG. 18 is a cross-sectional view of Y1-Y1 line of FIG. 17. The internal configuration of the semiconductor device is looked through in FIG. 17.

Semiconductor device 1B of Embodiment 4 is a semiconductor device of the QFP (Quad Flat Package) structure which built the microprocessor system as a whole storing semiconductor chip 2P for logical circuits and semiconductor chip 2M3 for memory circuits in the same sealing body 4 in the state where they are accumulated on the main surface of tab (die pad) 25a of a lead frame.

In Embodiment 4, lead frame 25 is used as a chip mounting member. Lead frame 25 consists of metallic thin plates, such as copper or 42 alloy, for example, and has tab 25a, a plurality of leads 25b arranged at the periphery, and tab suspension lead 25c prolonged toward an outside direction from the four corners of tab 25a.

Lead 25b has inner lead 25bi and outer lead 25bo in one. Inner lead 25bi is a portion inside sealing body 4 in lead 25b, and outer lead 25bo is a portion of the outside of sealing body 4 in lead 25b.

On the main surface of this tab 25a, semiconductor chip (first semiconductor chip) 2P is adhered and fixed by DAF 5a. This semiconductor chip 2P is formed by for example, the semiconductor thin plate of the plane square shape which consists of a silicon single crystal, and for example, a logical circuit like a microprocessor or ASIC (Application Specific Integrated Circuit) is formed on the main surface.

Near the periphery of this semiconductor chip 2P, a plurality of pads are arranged along the periphery. This pad is formed, for example with aluminum or an aluminum alloy. A plurality of pads of this semiconductor chip 2P are electrically connected to inner lead 25bi via a plurality of wires (first bonding wire) 6d of a forward bonding method. Wire 6d is formed, for example with gold.

On the main surface of the above-mentioned semiconductor chip 2P, semiconductor chip (second semiconductor chip) 2M3 is adhered and fixed by DAF 5c. This semiconductor chip 2M3 is formed by for example, the semiconductor thin plate of the plane rectangular form which consists of a silicon single crystal, and for example, SDRAM (Synchronous Dynamic Random Access Memory) of 16 MB (megabyte) is formed on the main surface.

This semiconductor chip 2M3 is arranged near the one-side of lower layer semiconductor chip 2P. Near the long side (side in alignment with one side of the above-mentioned semiconductor chip 2P) of this one side of semiconductor chip 2M3, along the long side of semiconductor chip 2M3, a plurality of pads are located and arranged in a line. This pad is also formed, for example with aluminum or an aluminum alloy. A plurality of pads of this semiconductor chip 2M3 are electrically connected to inner lead 25bi via a plurality of wires (second bonding wire) 6e of a forward bonding method. Wire 6e is formed, for example with gold.

Also in Embodiment 4, the plane size (vertical and width, area) of semiconductor chip 2M3 of the upper layer is smaller than the plane size (vertical and width, area) of lower layer semiconductor chip 2P. In the case of Embodiment 4, wire 6e connected to semiconductor chip 2M3 of the upper layer does not contact the main surface corner part of lower layer semiconductor chip 2P. However, the wire 6e may contact wire 6d connected to lower layer semiconductor chip 2P.

Then, also in Embodiment 4, thickness of DAF 5c of the back surface of semiconductor chip 2M3 of the upper layer is made thicker than DAF 5a of the back surface of lower layer semiconductor chip 2P. Hereby, since the height of the first bond of wire 6e can be made high, wire 6e of the upside can be separated from lower wire 6d by that extent. For this reason, since the defective potential that upper wire 6e contacts lower wire 6d can be reduced, the assembling property and reliability of semiconductor device 1B can be improved.

Since the loop of wire 6e does not become high by this structure, lack of hiding or exposure of wire 6e are not generated, either. Therefore, the yield of semiconductor device 1B can be improved.

Also in Embodiment 4, the thickness of semiconductor chip 2M3 of the upper layer is thicker than lower layer semiconductor chip 2P. Hereby, a warp of semiconductor device 1B can be suppressed like the Embodiment 1, without thickening semiconductor device 1B.

Also in Embodiment 4, by having thickened DAF 5c like the Embodiment 1, even if a chipping occurs with the back surface of semiconductor chip 2M3, it can be reduced or prevented that the waste silicon by the chipping turns to the back surface of DAF 5c. Therefore, poor damage of the main surface of semiconductor chip 2P resulting from waste silicon can be reduced or prevented.

A warp of semiconductor chip 2M3 is absorbable like the Embodiment 1 by having thickened DAF 5c with DAF 5c. By this, even if it thickens semiconductor chip 2M3, adhesion area of semiconductor chip 2M3 and semiconductor chip 2P can be made wide, and the clearance between the peripheral parts of semiconductor chip 2M3 can be reduced. Therefore, peeling and the crack of semiconductor chip 2M3 can be reduced or prevented.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, in the embodiment, the case where it applied to the semiconductor device of package structure with which a plurality of bump electrodes have been arranged at the back surface of a semiconductor device was explained. However, without limiting to this, it is applicable also to the semiconductor device of LGA (Land Grid Array) package structure with which the flat rear electrode at the back surface of a semiconductor device has been arranged in the shape of an array, for example.

The present invention is applicable to the manufacture of a semiconductor device.

What is claimed is:

1. A method of manufacturing a semiconductor device comprising the steps of:
   (a) providing a substrate including a front surface, a plurality of first electrodes formed on said front surface, a plurality of wirings formed on said front surface and electrically connected with said first electrodes, respectively, a solder resist formed over said front surface such that said first electrodes are exposed from said solder resist, and a rear surface opposite to said front surface, and said wirings being covered with said solder resist;
   (b) mounting a first semiconductor chip, including a first main surface, a plurality of first bonding pads formed on said first main surface and a first back surface opposite to said first main surface, over said solder resist via a first insulating film such that said first back surface of said first semiconductor chip faces said front surface of said substrate; and
   (c) electrically connecting said first bonding pads with said first electrodes via a plurality of first bonding wires,
   wherein in said step (a), said solder resist is formed by applying a resist over said front surface of said substrate twice.

2. The method of manufacturing the semiconductor device according to claim 1,
   wherein after said step (b), a second semiconductor chip, including a second main surface, a plurality of second bonding pads formed on said second main surface and a second back surface opposite to said second main surface, is mounted over said first main surface of said first semiconductor chip via a second insulating film such that said second back surface of said second semiconductor chip faces said first main surface of said first semiconductor chip, and said second bonding pads are electrically connected with a plurality of second electrodes formed on said front surface of said substrate via a plurality of second bonding wires.

\* \* \* \* \*